United States Patent
Lin et al.

(10) Patent No.: US 9,095,084 B2
(45) Date of Patent: Jul. 28, 2015

(54) STACKED MULTILAYER STRUCTURE

(71) Applicant: KINSUS INTERCONNECT TECHNOLOGY CORP., Taoyuan (TW)

(72) Inventors: Ting-Hao Lin, Taipei (TW); Yu-Te Lu, Taoyuan Hsien (TW); De-Hao Lu, Taoyuan County (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 19 days.

(21) Appl. No.: 13/853,303

(22) Filed: Mar. 29, 2013

(65) Prior Publication Data

US 2014/0290983 A1 Oct. 2, 2014

(51) Int. Cl.
| | |
|---|---|
| H05K 1/00 | (2006.01) |
| H05K 1/09 | (2006.01) |
| H05K 1/03 | (2006.01) |
| H05K 1/11 | (2006.01) |
| H05K 3/46 | (2006.01) |
| H05K 3/38 | (2006.01) |

(52) U.S. Cl.
CPC ............ *H05K 3/4647* (2013.01); *H05K 1/0366* (2013.01); *H05K 3/38* (2013.01)

(58) Field of Classification Search
CPC ............................. H05K 1/0298; H05K 1/092
USPC .......................... 174/250, 251, 255, 256, 261
See application file for complete search history.

(56) References Cited

U.S. PATENT DOCUMENTS

| | | | | |
|---|---|---|---|---|
| 4,159,222 | A * | 6/1979 | Lebow et al. ................... | 216/20 |
| 5,196,089 | A * | 3/1993 | Takada et al. .................. | 216/13 |
| 7,847,197 | B2 * | 12/2010 | Oikawa et al. ................ | 174/262 |
| 8,237,058 | B2 * | 8/2012 | Freda et al. ................... | 174/258 |
| 2001/0006117 | A1 * | 7/2001 | Cheng ........................... | 174/257 |
| 2005/0239357 | A1 * | 10/2005 | Wesch et al. .................. | 442/59 |
| 2010/0018758 | A1 * | 1/2010 | Yoshimura et al. ........... | 174/256 |
| 2011/0220396 | A1 * | 9/2011 | Abe ............................... | 174/251 |
| 2014/0102767 | A1 * | 4/2014 | Kang et al. .................... | 174/251 |
| 2014/0290057 | A1 * | 10/2014 | Lin et al. ........................ | 29/846 |

* cited by examiner

*Primary Examiner* — Timothy Thompson
*Assistant Examiner* — Rhadames J Alonzo Miller
(74) *Attorney, Agent, or Firm* — Lin & Associates IP, Inc.

(57) ABSTRACT

A stacked multilayer structure, including a first circuit layer having bumps, a plastic film stacked on the first circuit layer to fill up the space among the bumps so as to form a co-plane, and a second circuit layer formed on the co-plane and connected to the first circuit layer. The plastic film includes a glass fiber layer which is embedded and not exposed.

4 Claims, 5 Drawing Sheets

STACKED MULTILAYER STRUCTURE

BACKGROUND OF THE INVENTION

1. Field of the Invention

The present invention generally relates to a stacked multilayer structure, and more specifically to a glass fiber layer embedded in a plastic film and not exposed to increase the reliability of a second circuit layer.

2. The Prior Arts

Please refer to FIG. 1 and FIGS. 2A to 2G. As shown in FIG. 1, the method S100 of manufacturing the stacked multilayer structure in the prior arts comprises the steps S110 to S160. FIGS. 2A to 2G are used to illustrate the method in more detail.

As shown in FIG. 2A, a substrate 10 is stacked with a first circuit layer 20 through the process of image transfer in the step S110. The first circuit layer 20 has a plurality of bumps 21. The step S120 is performed to press the plastic film 30 having a glass fiber layer 35 therein against the substrate 10 having the first circuit layer 20 thereon, as shown in FIGS. 2B and 2C. After pressed, the glass fiber layer 35 is obviously deformed because the first circuit layer 20 is not smooth.

In the step S130, the pressed plastic film 30 is polished until the bumps 21 are exposed such that part of the glass fiber layer 35 above the bumps 21 is removed and the remaining part of the glass fiber layer 35 is thus exposed, as shown in FIG. 2D. Next, in the step S140 as shown in FIG. 2E, a second metal layer 23 is formed on the resulting surface by evaporation or sputtering. The step S150 is performed to form a second circuit layer 25 from the second metal layer 23 by the process of image transfer such that the second circuit layer 25 is connected to the first circuit layer 20, as shown in FIG. 2F. Finally, the substrate 10 is removed in the step S160 to form the stacked multilayer structure, as shown in FIG. 2G.

One of the shortcomings in the prior arts is that the second metal layer 23 or the second circuit layer 25 is likely to peel off because the glass fiber layer is partly exposed and the adhesion between the glass fiber layer and the metal is considerably poor even the second metal layer 23 is formed by evaporation or sputtering. As a result, the yield and reliability greatly deteriorate. Therefore, it is needed to provide a new stacked multilayer structure to overcome the above problems in the prior arts.

SUMMARY OF THE INVENTION

The primary objective of the present invention is to provide a stacked multilayer structure, comprising a first circuit layer having bumps, a plastic film stacked on the first circuit layer to fill up the space among the bumps so as to form a co-plane, and a second circuit layer formed on the co-plane and connected to the first circuit layer. The plastic film comprises a glass fiber layer which is embedded and not exposed.

Additionally, the stacked multilayer structure of the present invention further comprises a metal layer formed on part of the plastic film such that the co-plane is formed by the metal layer, the plastic film and the bumps.

Therefore, the adhesion between the plastic film and the second circuit layer is greatly improved because the glass fiber layer of the plastic film filling up the space among the bumps is not deformed and exposed outwards. Therefore, the yield and reliability of the stacked multilayer structure is increased.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENT

The present invention may be embodied in various forms and the details of the preferred embodiments of the present invention will be described in the subsequent content with reference to the accompanying drawings. The drawings (not to scale) show and depict only the preferred embodiments of the invention and shall not be considered as limitations to the scope of the present invention. Modifications of the shape of the present invention shall too be considered to be within the spirit of the present invention.

Figure 1:
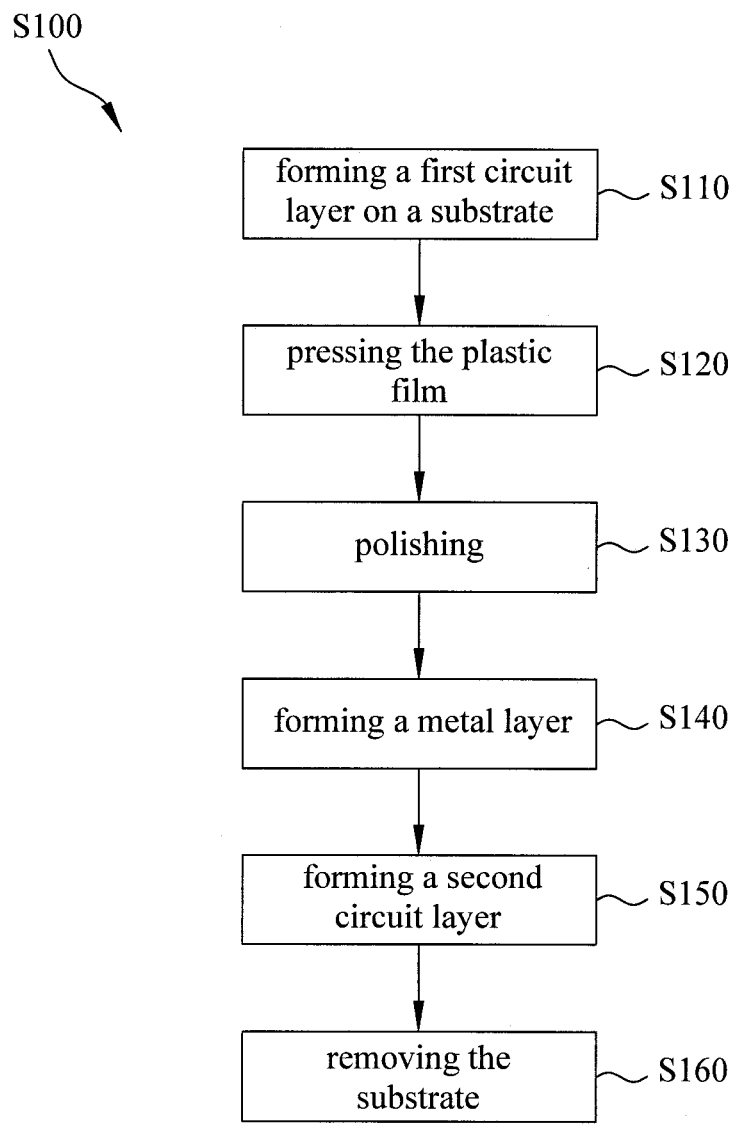
FIG. 1 is a flow diagram showing a method of manufacturing the stacked multilayer structure in the prior arts.
Figure 2A:
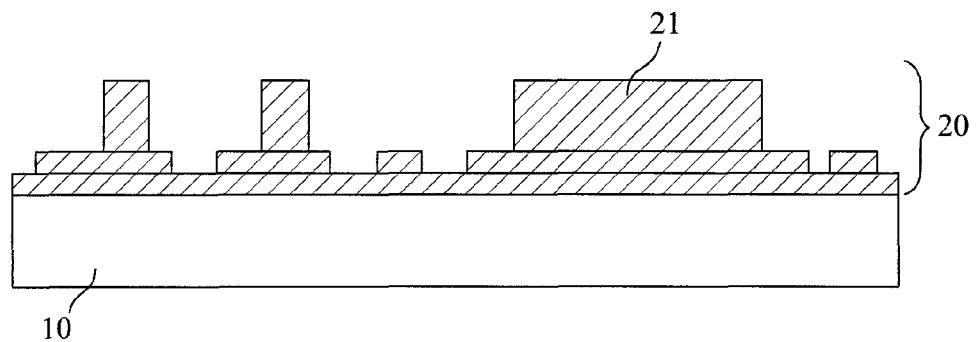
FIGS. 2A to 2G are views showing the steps of the method in the prior arts, respectively.
Figure 2B:
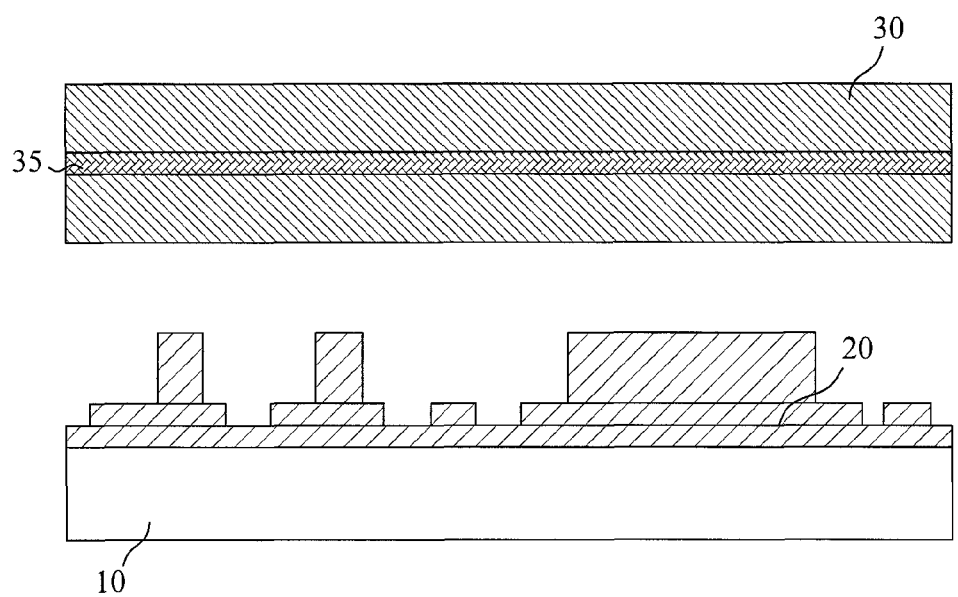
Figure 2C:
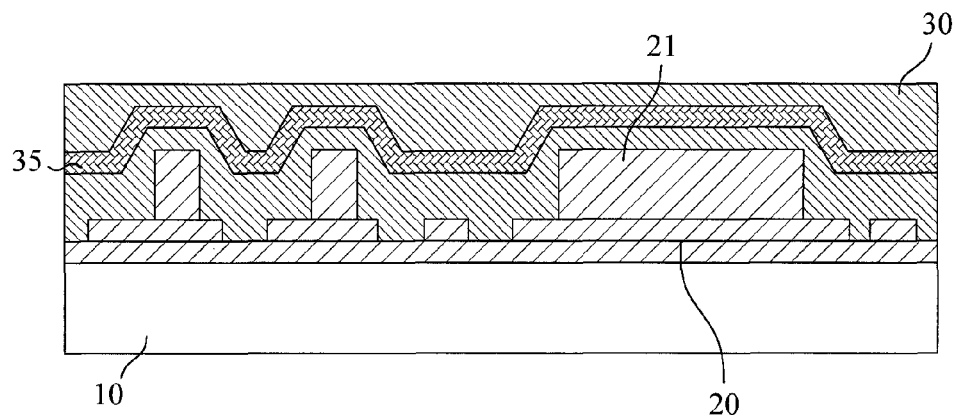
Figure 2D:
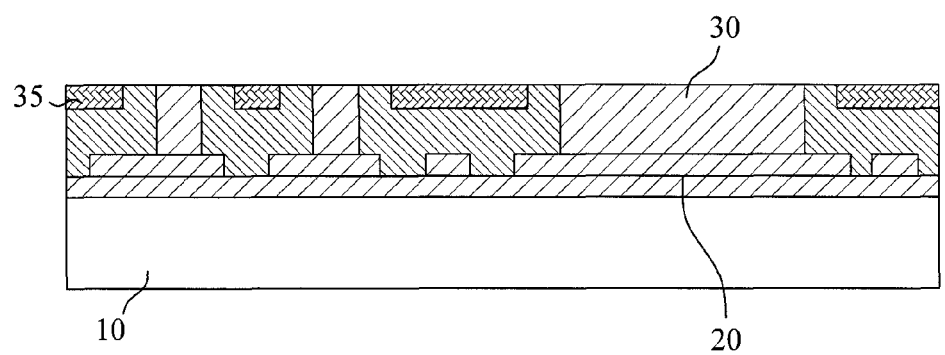
Figure 2E:
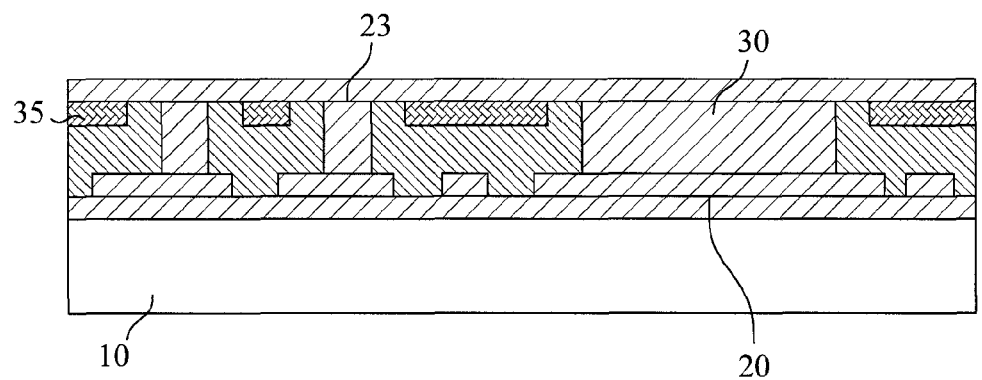
Figure 2F:
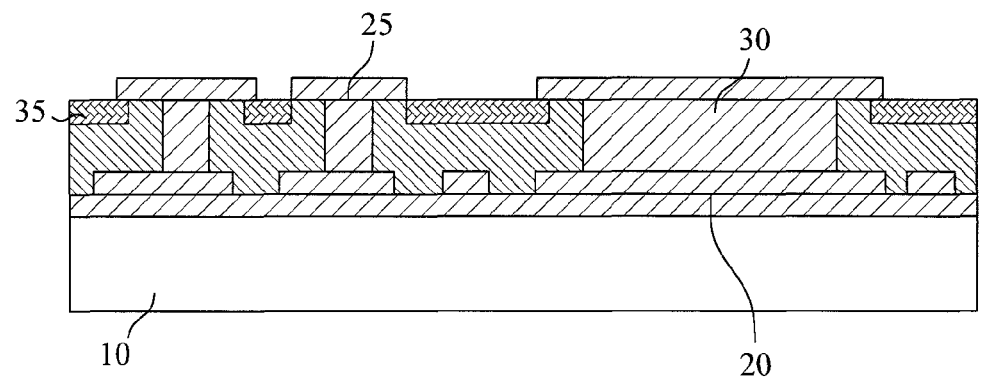
Figure 2G:
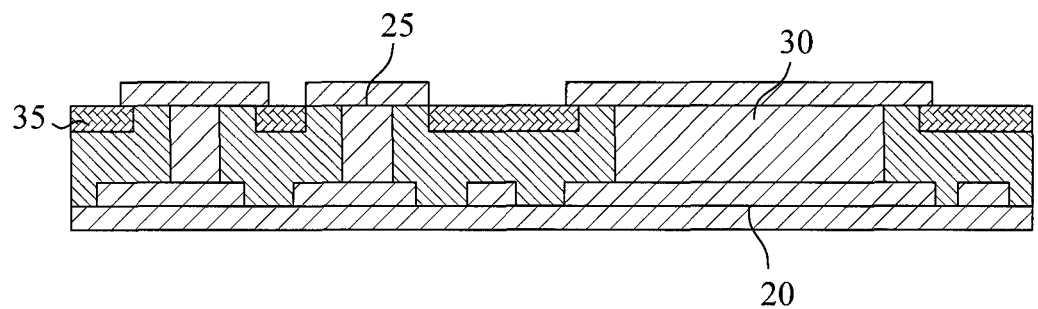
Figure 3:
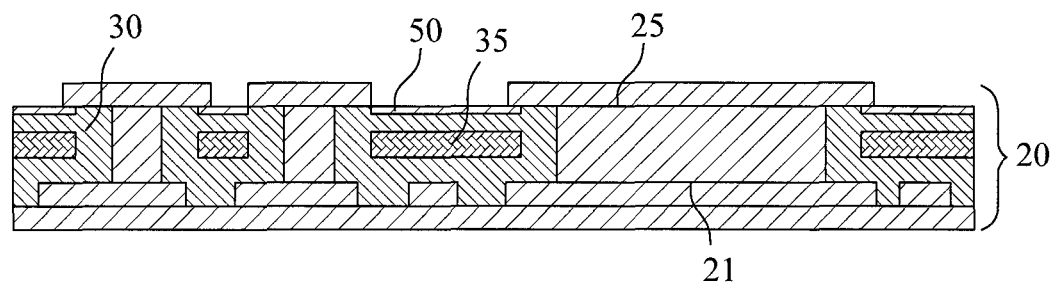
FIG. 3 is a view showing the stacked multilayer structure according to one embodiment of the present invention.

Please refer to FIG. 3 schematically illustrating the stacked multilayer structure according to one embodiment of the present invention. As shown in FIG. 3, the stacked multilayer structure 1 of the present invention comprises a first circuit layer 20, a plastic film 30 and a second circuit layer 25. The first circuit layer 20 has a plurality of bumps 21. The plastic film 30 is stacked on the first circuit layer 20 and fills up the space among the bumps 21 such that a co-plane is formed by the plastic film 30 and the bumps 21. The plastic film 30 comprises a glass fiber layer 35 which is embedded and not exposed. The second circuit layer 25 is formed on the co-plane and connected to the first circuit layer 20.

Additionally, the stacked multilayer structure 1 of the present invention further comprises a metal layer 50 formed on part of the plastic film 30 such that the co-plane is formed by the top surfaces of the metal layer 50, the plastic film 30 and the bumps 21. As can be seen in FIG. 3, the glass fiber layer 35 has glass fiber members embedded between two adjacent bumps 21 in the plastic film 30, and the metal layer 50 is formed in such a way that each glass fiber member in the glass fiber layer 35 has a metal member of the metal layer 50 directly above the glass fiber member.

The first circuit layer 20 and the second circuit layer 25 comprise at least one of copper, gold, silver, aluminum, palladium, and nickel. The metal layer 50 comprises at least one of copper, gold, silver, palladium, and nickel. As shown in FIG. 3, the metal layer is formed above the glass fiber layer 35 between two adjacent bumps 21. The second circuit layer 25 is connected through the bumps 21 to the first circuit layer with a portion of the top surface of the metal layer 50 exposed.

One aspect of the present invention is that the adhesion between plastic film 30 and the second circuit layer 25 is greatly improved because the glass fiber layer 35 of the plastic film 30 filling up the space among the bumps 21 is not deformed and exposed outwards. Therefore, the yield and reliability of the stacked multilayer structure is increased. Furthermore, only the bumps are polished in the subsequent process so as to reduce the difference in the thickness of the dielectric due to polishing.

Although the present invention has been described with reference to the preferred embodiments, it will be understood that the invention is not limited to the details described thereof Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A stacked multilayer structure, comprising:
   a first circuit layer having a plurality of bumps;
   a plastic film stacked on the first circuit layer to fill up the space among the bumps, wherein the plastic film comprises a glass fiber layer which is embedded and not exposed, and the glass fiber layer has glass fiber members embedded between adjacent bumps in the plastic film;
   a metal layer provided on the plastic film above the glass fiber layer to form a co-plane by top surfaces of the bumps, the metal layer, and the plastic film with each glass fiber member of the glass fiber layer having a metal member in the metal layer formed directly above the glass fiber member; and
   a second circuit layer formed on the co-plane and connected through the bumps to the first circuit layer with a portion of the top surface of the metal layer exposed.

2. The stacked multilayer structure as claimed in claim 1, wherein the first circuit layer and the second circuit layer comprise at least one of copper, gold, silver, aluminum, palladium, and nickel.

3. The stacked multilayer structure as claimed in claim 1, wherein the metal layer comprises at least one of copper, gold, silver, palladium, and nickel.

4. The stacked multilayer structure as claimed in claim 1, wherein the metal layer is formed above the glass fiber layer between two adjacent bumps.

\* \* \* \* \*